(12) United States Patent
Saitou et al.

(10) Patent No.: US 9,531,340 B2
(45) Date of Patent: Dec. 27, 2016

(54) COMMUNICATION DEVICE AND METHOD OF ADJUSTING APPLIED VOLTAGE FOR MATCHING CIRCUIT

(71) Applicant: DENSO CORPORATION, Kariya, Aichi-pref. (JP)

(72) Inventors: Takashi Saitou, Okazaki (JP); Akira Takaoka, Okazaki (JP); Nobuya Watabe, Nagoya (JP); Takatoshi Sekizawa, Kariya (JP); Munenori Matsumoto, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 14/406,695

(22) PCT Filed: Jun. 11, 2013

(86) PCT No.: PCT/JP2013/003655
§ 371 (c)(1),
(2) Date: Dec. 9, 2014

(87) PCT Pub. No.: WO2013/187048
PCT Pub. Date: Dec. 9, 2013

(65) Prior Publication Data
US 2015/0162892 A1      Jun. 11, 2015

(30) Foreign Application Priority Data
Jun. 12, 2012   (JP) ................................. 2012-132982

(51) Int. Cl.
*H03H 7/40*       (2006.01)
*H04B 1/18*       (2006.01)

(52) U.S. Cl.
CPC . *H03H 7/40* (2013.01); *H04B 1/18* (2013.01)

(58) Field of Classification Search
CPC ...................................................... H03H 7/40
(Continued)

(56) References Cited

U.S. PATENT DOCUMENTS

| 4,395,778 A | 7/1983 | Osada et al. |
| 5,379,008 A * | 1/1995 | Bockelman .............. H03H 7/06 333/174 |

(Continued)

FOREIGN PATENT DOCUMENTS

| JP | H04358423 A | 12/1992 |
| JP | 6-021768 | 1/1994 |

(Continued)

OTHER PUBLICATIONS

Office Action dated Jun. 2, 2015 in corresponding Japanese Application No. 2012-132982.

(Continued)

*Primary Examiner* — Stephen E Jones
*Assistant Examiner* — Scott S Outten
(74) *Attorney, Agent, or Firm* — Harness, Dickey & Pierce, P.L.C.

(57) ABSTRACT

A communication device changes an applied voltage output from a voltage circuit, and allows a capacitance measuring device to measure the respective capacitance values of a variable capacitance element before and after a change in the applied voltage. The communication device calculates a voltage correction value for correcting an initial variation of the capacitance value of the variable capacitance element using the respective capacitance values of the variable capacitance element before and after the change in the applied voltage, and respective applied voltage values before and after the change, and a correction voltage for canceling the initial variation in the capacitance value of the (Continued)

variable capacitance element, and outputs the correction voltage from the voltage circuit.

5 Claims, 3 Drawing Sheets

(58) Field of Classification Search
USPC .......................................................... 333/32
See application file for complete search history.

(56) References Cited

U.S. PATENT DOCUMENTS

2005/0099249 A1\* 5/2005 Lai .......................... H03J 3/185
334/15
2011/0256841 A1 10/2011 Kakuya et al.

FOREIGN PATENT DOCUMENTS

| JP | 2001267950 A | 9/2001 |
| JP | 2007074271 A | 3/2007 |
| JP | 2011228834 A | 11/2011 |

OTHER PUBLICATIONS

International Search Report and Written Opinion (in Japanese with English Translation) for PCT/JP2013/003655, mailed Aug. 27, 2013; ISA/JP.

\* cited by examiner

COMMUNICATION DEVICE AND METHOD OF ADJUSTING APPLIED VOLTAGE FOR MATCHING CIRCUIT

CROSS REFERENCE TO RELATED APPLICATION

This application is a U.S. National Phase Application under 35 U.S.C. 371 of International Application No. PCT/JP2013/003655 filed on Jun. 11, 2013 and published in Japanese as WO 2013/187048 A1 on Dec. 19, 2013. This application is based on and claims the benefit of priority from Japanese Patent Application No. 2012-132982 filed Jun. 12, 2012. The entire disclosures of all of the above applications are incorporated herein by reference.

TECHNICAL FIELD

The present disclosure relates to a communication device including a matching circuit having a variable capacitance element, and a method of adjusting an applied voltage for the matching circuit having the variable capacitance element.

BACKGROUND ART

Conventionally, there is a wireless communication device including a local oscillator that outputs a local oscillator signal, and a voltage detector circuit that detects a voltage value of an output signal from a receiver circuit. The wireless communication device is designed to change over a switch so that the local oscillator signal output from the local oscillator is input to a matching circuit with a variable capacitance element having a capacitance value changed according to an applied voltage value at the time of adjusting an impedance of the matching circuit. The wireless communication device is also designed to automatically control an impedance of the matching circuit so that the voltage value of the output signal of the receiver circuit, which is detected by the voltage detector circuit, comes closer to a predetermined reference voltage value (for example, refer to PTL 1). The device of this type can always adjust the impedance of the matching circuit even after product shipment.

CITATION LIST

Patent Literature

PTL 1: JP-A-2011-228834 (corresponding to U.S. Pat. No. 8,358,989)

SUMMARY OF INVENTION

Technical Problem

However, as in the device disclosed in the above PTL 1, in a configuration designed to change over the switch so that the local oscillator signal output from the local oscillator is input to the matching circuit with the variable capacitance element to automatically control the impedance of the matching circuit, the provision of the local oscillator, the voltage detector circuit, and the switch is required. As a result, the configuration is complicated, and a circuit scale becomes larger because the number of parts is larger, and the costs increase.

In the impedance adjustment of the matching circuit of this type, even if it is impossible to always adjust the impedance of the matching circuit as in the device disclosed in the PTL 1, such a case may be often allowed by adjusting the impedance of the matching circuit with high precision before product shipment.

In this case, it is preferable that an applied voltage that is applied to the variable capacitance element is set to an optimal voltage with a simpler configuration and with a simpler operation, thereby making it possible to adjust the impedance of the matching circuit.

Under the circumstances, a method is proposed in which an optimal applied voltage (optimal voltage) to be applied to the variable capacitance element included in the matching circuit is specified in advance, and a voltage is adjusted so that the optimal voltage is applied to the variable capacitance element to adjust the impedance of the matching circuit.

However, in the above method, even if the voltage to be applied to the variable capacitance element included in the matching circuit can be set to the optimal voltage, a variation (initial variation) in the capacitance value of the variable capacitance element due to an individual difference is large, resulting in such a problem that it is difficult to adjust the impedance of the matching circuit with high precision.

The present disclosure has been made in view of the above problem, and aims at providing a communication device and a method of adjusting an applied voltage in a matching circuit, which can adjust the applied voltage of a variable capacitance element so as to suppress an influence of an initial variation in a capacitance value of the variable capacitance element with a simple configuration and with a simple operation.

Solution to Problem

According to one aspect of the present disclosure, a communication device includes a matching circuit that includes a variable capacitance element having a capacitance value varied according to an applied voltage output from a voltage circuit, and a control unit that controls the applied voltage output from the voltage circuit. The control unit includes a capacitance value measurement unit, a voltage correction value calculation unit, a correction voltage calculation unit, and a voltage circuit control unit. The capacitance value measurement unit changes the applied voltage output from the voltage circuit, and allows a capacitance measuring device connected to the variable capacitance element to measure respective capacitance values of the variable capacitance element before and after a change in the applied voltage. The voltage correction value calculation unit calculates a voltage correction value for correcting an initial variation of the capacitance value of the variable capacitance element using the respective capacitance values before and after the change in the applied voltage of the variable capacitance element, and respective applied voltage values before and after the change. The correction voltage calculation unit calculates a correction voltage of the variable capacitance element for canceling the initial variation in the capacitance value of the variable capacitance element using the voltage correction value. The voltage circuit control unit adjusts the applied voltage output from the voltage circuit so as to output the correction voltage from the voltage circuit.

The communication device can adjust the applied voltage of the variable capacitance element so as to suppress an influence of the initial variation in the capacitance value of the variable capacitance element with the simple configuration and with the simple operation.

According to another aspect of the present disclosure, there is provided a method of adjusting an applied voltage for a matching circuit that includes a variable capacitance element having a capacitance value varied according to an applied voltage output from a voltage circuit. In the method of adjusting an applied voltage, the applied voltage output from the voltage circuit is changed, and a capacitance measuring device connected to the variable capacitance element is allowed to measure respective capacitance values of the variable capacitance element before and after a change in the applied voltage. A voltage correction value for correcting an initial variation of the capacitance value of the variable capacitance element is calculated using the respective capacitance values of the variable capacitance element before and after the change in the applied voltage, and respective applied voltage values before and after the change. A correction voltage of the variable capacitance element for canceling the initial variation in the capacitance value of the variable capacitance element is calculated using the voltage correction value. The applied voltage output from the voltage circuit is adjusted so as to output the correction voltage from the voltage circuit.

The method of adjusting an applied voltage can adjust the applied voltage of the variable capacitance element so as to suppress an influence of the initial variation in the capacitance value of the variable capacitance element with the simple configuration and with the simple operation.

BRIEF DESCRIPTION OF DRAWINGS

The above and other objects, features and advantages of the present disclosure will become more apparent from the following detailed description made with reference to the accompanying drawings. In the drawings:

FIG. 1 illustrates a configuration of a communication device 1 that includes a matching circuit having a variable capacitance element according to an embodiment of the present disclosure. The communication device 1 includes a matching circuit 20 with a variable capacitance diode 21 having a capacitance value varied according to an applied voltage output from a voltage circuit 50, and a control unit 40 that controls the applied voltage output from the voltage circuit 50. FIG. 1 also illustrates a capacitance measuring device 2 that measures the capacitance of the variable capacitance diode 21, and a control board 3.

Figure 1:
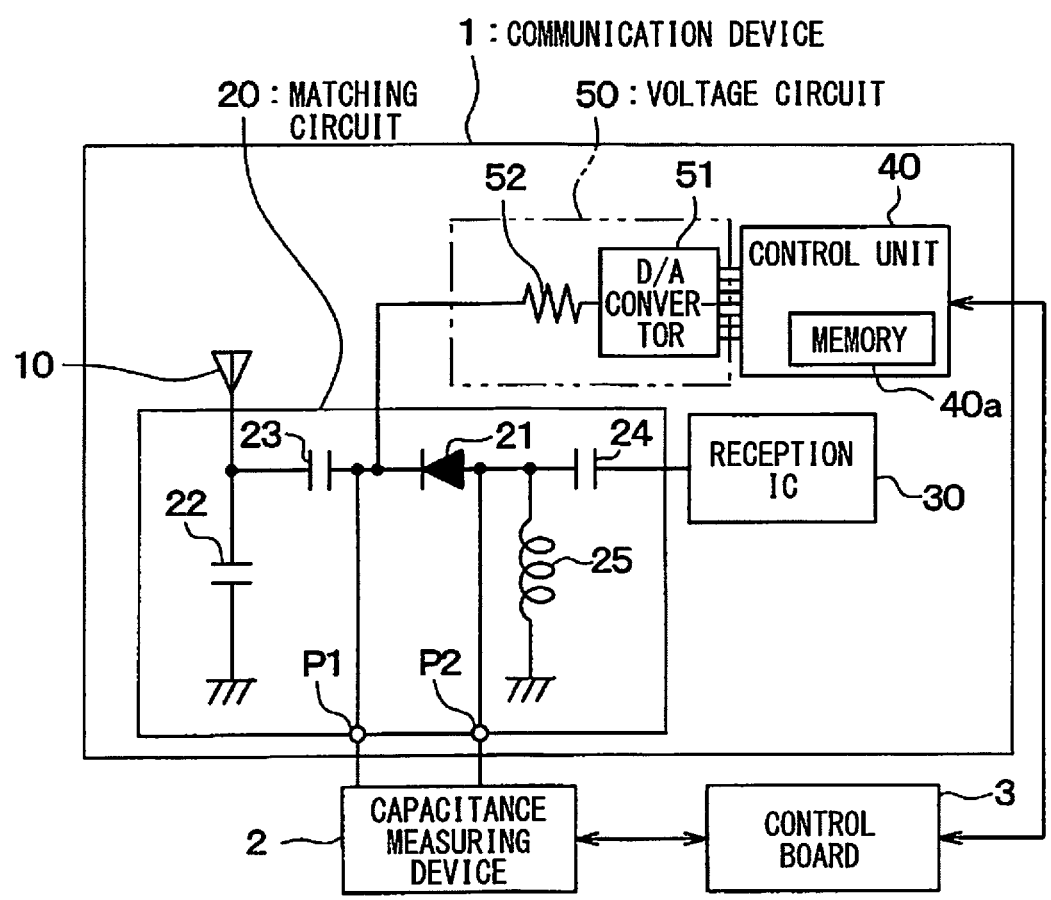
FIG. 1 is a diagram illustrating a configuration of a communication device having a matching circuit according to an embodiment of the present disclosure.

The communication device 1 includes an antenna 10, the matching circuit 20, a receiver IC 30, the control unit 40, and the voltage circuit 50.

The matching circuit 20 conducts an impedance matching between the antenna 10 that receives radio waves, and the receiver IC 30. The matching circuit 20 includes the variable capacitance diode 21, capacitors 22 to 24, and an inductor 25 as the variable capacitance element.

Also, an anode terminal and a cathode terminal of the variable capacitance diode 21 are respectively connected with test pins P1 and P2 for connecting respective measurement terminals of the capacitance measuring device 2 for measuring a capacitance value of the variable capacitance diode 21.

The capacitance value of the variable capacitance diode 21 changes according to the applied voltage output from the voltage circuit 50. In the present embodiment, the voltage value output from the voltage circuit 50 is set to an optimal voltage to adjust the impedance of the matching circuit 20.

The receiver IC 30 amplifies and demodulates a received signal input from the antenna 10 through the matching circuit 20, and extracts various pieces of data included in the received signal.

The control unit 40 is configured by a microcomputer having a CPU, an I/O, and a communication unit. Also, the control unit 40 has a memory 40a that stores the various pieces of data therein. The control unit 40 implements various processing according to a program stored in the memory 40a.

The voltage circuit 50 outputs the applied voltage to be applied to the variable capacitance diode 21 of the matching circuit 20. The voltage circuit 50 includes a D/A converter circuit 51 that converts digital signals output in parallel from the control unit 40 into an analog signal, and a resistor 52.

The applied voltage corresponding to the digital signals output in parallel from the control unit 40 is output from the voltage circuit 50, and applied to the variable capacitance diode 21 of the matching circuit 20.

The capacitance measuring device 2 is configured to measure the capacitance value of the variable capacitance diode 21. The measurement terminals of the capacitance measuring device 2 are connected to the test pin P1 connected to the cathode of the variable capacitance diode 21, and the test pin P2 connected to the anode of the variable capacitance diode 21.

Also, the capacitance measuring device 2 is connected to the control unit 40 of the communication device 1 through the control board 3.

The capacitance measuring device 2, and the control unit 40 of the communication device 1 are connected to each other through the control board 3, and enable a bidirectional communication through the control board 3. The capacitance measuring device 2 measures the capacitance value in response to a request from the control unit 40, and transmits a measurement result to the control unit 40 through the control board 3.

The control board 3 is configured to conduct a communication control between the capacitance measuring device 2 and the control unit 40. Also, the control board 3 is provided with operation switches such as a power supply switch for giving an instruction on the start or stop of power delivery from a DC stabilized power supply (not shown) to the communication device 1, and an adjustment start switch for giving an instruction on the start of the impedance adjustment of the matching circuit 20.

Figure 2:
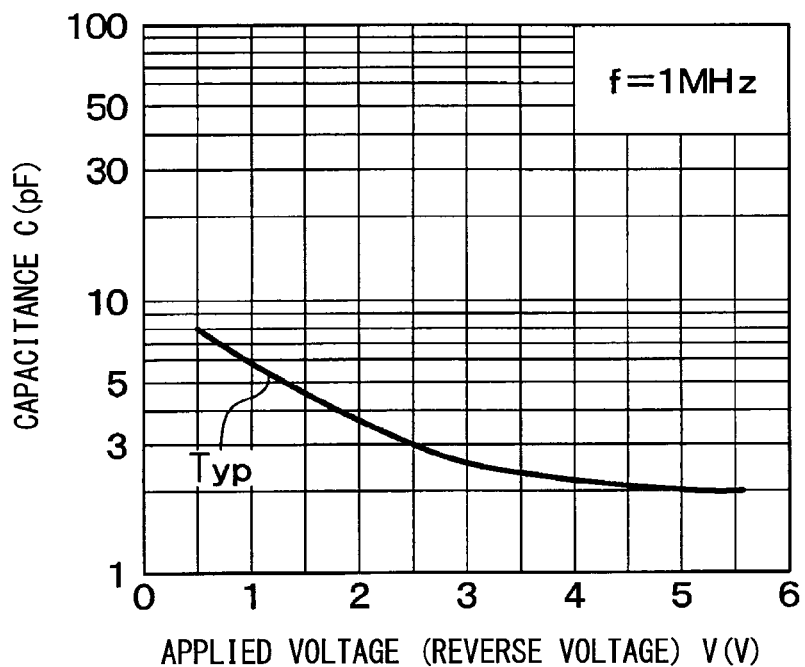
FIG. 2 is a diagram illustrating an example of a C-V characteristic of a variable capacitance diode.

Subsequently, a C-V characteristic of the variable capacitance diode 21 will be described. FIG. 2 illustrates an example of the C-V characteristic of the variable capacitance diode 21. The axis of X in the figure represents the applied voltage (reverse voltage) V (V), and the axis of Y is a capacitance C (pF). The C-V characteristic in the figure is obtained in a frequency band of 1 (MHz), and indicated as typical values.

As illustrated in the figure, the capacitance C of the variable capacitance diode 21 becomes smaller as the applied voltage (reverse voltage) V is larger. In the present example, when it is assumed that the applied voltage is X, the capacitance C of the variable capacitance diode 21 can be expressed as a function of X represented by Numerical Expression 1.

Numerical Expression 1

$$C=F(X) \qquad [\text{Ex. 1}]$$

In the present embodiment, the matching circuit 20 is not adjusted by inputting a local oscillator signal to the matching circuit 20 having the variable capacitance diode 21, but the applied voltage output from the voltage circuit 50 is changed, the capacitance measuring device 2 connected to the variable capacitance diode 21 is allowed to measure the respective capacitance values of the variable capacitance diode 21 before and after a change in the applied voltage, the voltage correction value for correcting the initial variation in the capacitance value of the variable capacitance diode 21 is calculated from the respective measured capacitance values using the C–V characteristic of the variable capacitance diode 21, the correction voltage of the variable capacitance diode 21 for canceling the initial variation in the capacitance value of the variable capacitance diode 21 is calculated using the voltage correction value, and the applied voltage output from the voltage circuit 50 is so controlled as to output the correction voltage from the voltage circuit 50.

The variable capacitance diode 21 is configured to change the capacitance value according to a value of a reverse bias voltage that is applied between the anode and the cathode thereof. The variable capacitance diode 21 has a variation in the capacitance value of about 10% due to an individual difference. It is conceivable that a main cause of the variation in the capacitance value is a manufacturing variation of the variable capacitance diode 21.

Figure 3:
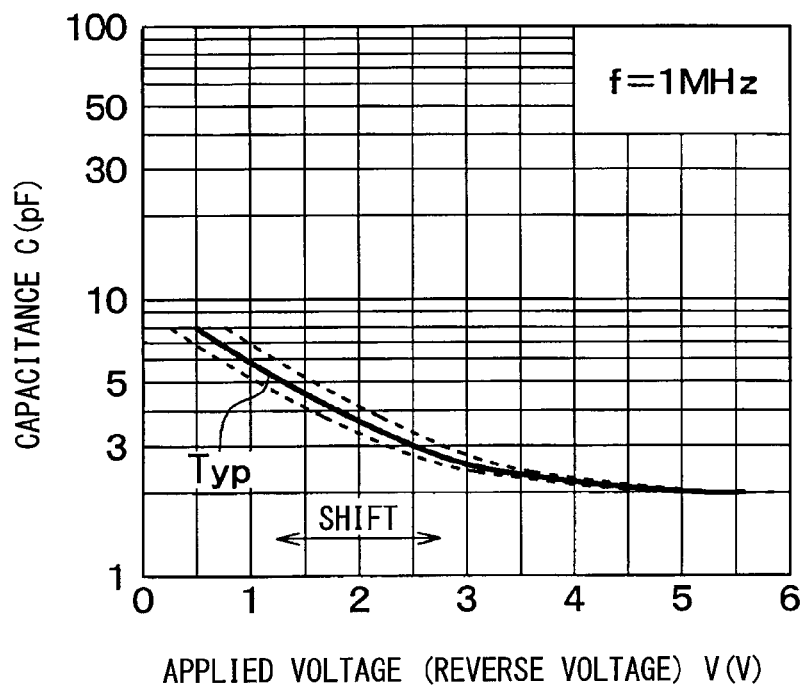
FIG. 3 is a diagram illustrating a state of a variation in the C-V characteristic of the variable capacitance diode.

As a result of inspecting the variation in the C–V characteristic using the plural variable capacitance diodes 21, it can be confirmed that the variation in the C–V characteristic shifts in a positive direction or a negative direction of the X-axis as indicated by dotted lines in FIG. 3.

In the present embodiment, the voltage correction value $\alpha$ is calculated assuming that a measured value of the applied voltage value of the variable capacitance diode 21 is x, and the voltage correction value for correcting the initial variation of the capacitance value of the variable capacitance diode 21 is $\alpha$.

In the present example, when X indicated in Numerical Expression 1 is substituted as X=x–$\alpha$, a function indicated in Numerical Expression 1 can be expressed as Numerical Expression 2.

Numerical Expression 2

$$C=F(x-\alpha) \qquad [\text{Ex. 2}]$$

x: applied voltage value $\alpha$: the amount of initial variation

Also, the applied voltage of the variable capacitance diode 21 is set to a first voltage V1, and a measured capacitance measured by the capacitance measuring device 2 in the present situation is set as C1. The applied voltage of the variable capacitance diode 21 is set to a second voltage V2, and a measured capacitance measured by the capacitance measuring device 2 in the present situation is set as C2. In the present case, a relationship of Numerical Expression 3 is satisfied.

Numerical Expression 3

$$C1-C2=F(V1-\alpha)-F(V2-\alpha) \qquad [\text{Ex. 3}]$$

On the other hand, the standard C–V characteristic of the variable capacitance diode 21 illustrated in FIG. 1 is expressed by an approximate expression indicated by Numerical Expression 4.

Numerical Expression 4

$$f=0.0106*X^4-0.2048*X^3-1.5466*X^2-5.5771*X+10.296 \qquad [\text{Ex. 4}]$$

In Numerical Expression 2, when the first voltage V1=1.6 (V) is set, C1=15.94 (pF) is measured by the capacitance measuring device 2, and when the second voltage V2=3.0 (V) is set, C2=14.26 (pF) is measured by the capacitance measuring device 2. In the present case, a relationship of Numerical Expression 5 indicated as follows is satisfied from Numerical Expressions 2 and 3.

[Ex. 5]

$$15.94 - 14.29 = 0.0106*(1.6-\alpha)^4 - \\ 0.2048*(1.6-\alpha)^3 + 1.5466*(1.6-\alpha^2) - \\ 5.5771*(1.6-\alpha) + 10.296 - \\ (0.0106*(3.0-\alpha)^4 - 0.2048*(3.0-\alpha)^3 + \\ 1.5466*(3.0-\alpha)^2 - \\ 5.5771*(3.0-\alpha) + 10.296$$

Numerical Expression 5

In the present case, the voltage correction value $\alpha$ is calculated as Numerical Expression 6 from Numerical Expression 5.

Numerical Expression 6

$$\alpha=-0.05 \qquad [\text{Ex. 6}]$$

Subsequently, the capacitance value of the single variable capacitance diode 21 is calculated. A relationship of Numerical Expression 7 indicated as follows is satisfied from Numerical Expressions 4 and 6.

Numerical Expression 7

$$f=0.0106*(X-\alpha)^4-0.2048*(X-\alpha)^3-1.5466*(X-\alpha)^2- \\ 5.5771*(X-\alpha)+10.296 \qquad [\text{Ex. 7}]$$

Subsequently, an optimal voltage to be applied to the variable capacitance diode 21 is identified. In the present embodiment, the optimal voltage to be applied to the variable capacitance diode 21 is identified using Numerical Expression 7. A set value of the capacitance value of the variable capacitance diode 21 in the matching circuit 20 is different depending on the antenna 10.

For example, when the set value of the capacitance value in the variable capacitance diode 21 is to be set to 3 (pF), the optimal voltage x (V) to be applied to the variable capacitance diode 21 can be calculated with f=3 (pF) and the voltage correction value $\alpha$=–0.05 in Numerical Expression 7.

As described above, in the present embodiment, the optimal voltage (correction voltage) of the variable capacitance diode 21 so as to cancel the initial variation of the capacitance value in the variable capacitance diode 21 is calculated using the voltage correction value $\alpha$, and the applied voltage output from the voltage circuit 50 is controlled to output the optimal voltage (correction voltage) from the voltage circuit 50.

Incidentally, the capacitance value of the single variable capacitance diode 21 can be calculated using Numerical Expression 7. For example, if the first voltage V1=1.6 (V) is set, the capacitance value of the single variable capacitance diode 21 can be calculated as 4.46 (pF) with x=1.6 (V) and α=−0.05. Also, if the second voltage V2=3.0 (V) is set, the capacitance value of the single variable capacitance diode 21 can be calculated as 2.78 (pF) with x=3.0 (V) and α=−0.05.

As a result of detaching the variable capacitance diode 21 from the board, and measuring the capacitance value of the single body, the capacitance value of the single body is 4.41 (pF) if the first voltage V1=1.6 (V) is satisfied, and the capacitance value of the single variable capacitance diode 21 is 2.74 (pF) if the second voltage V2=3.0 (V) is satisfied.

For comparison, when the capacitance value of the variable capacitance diode 21 is measured in a state where the variable capacitance diode 21 is mounted on the board together with the capacitors 22 to 24, and the inductor 25 as described above, C1=15.94 (pF) is satisfied with the first voltage V1=1.6 (V), and C2=14.26 (pF) is satisfied with the second voltage V2=3.0 (V). Thus, the capacitance value largely different from the capacitance value of the single variable capacitance diode 21 is measured.

However, even in the state where the variable capacitance diode 21 is mounted on the board, if the voltage correction value α for correcting the initial variation of the capacitance value in the variable capacitance diode 21 is calculated using the respective capacitance values C1 and C2 of the variable capacitance diode 21 before and after the change in the applied voltage, and the respective applied voltage values V1 and V2 before and after the change as described above. As a result, a calculation error in the case of the first voltage V1=1.6 (V) becomes 0.05 (pF), and a calculation error in the case of the second voltage V2=3.0 (V) becomes 0.04 (pF), and it is confirmed that the capacitance value of the variable capacitance diode 21 can be calculated with high precision.

Figure 4:
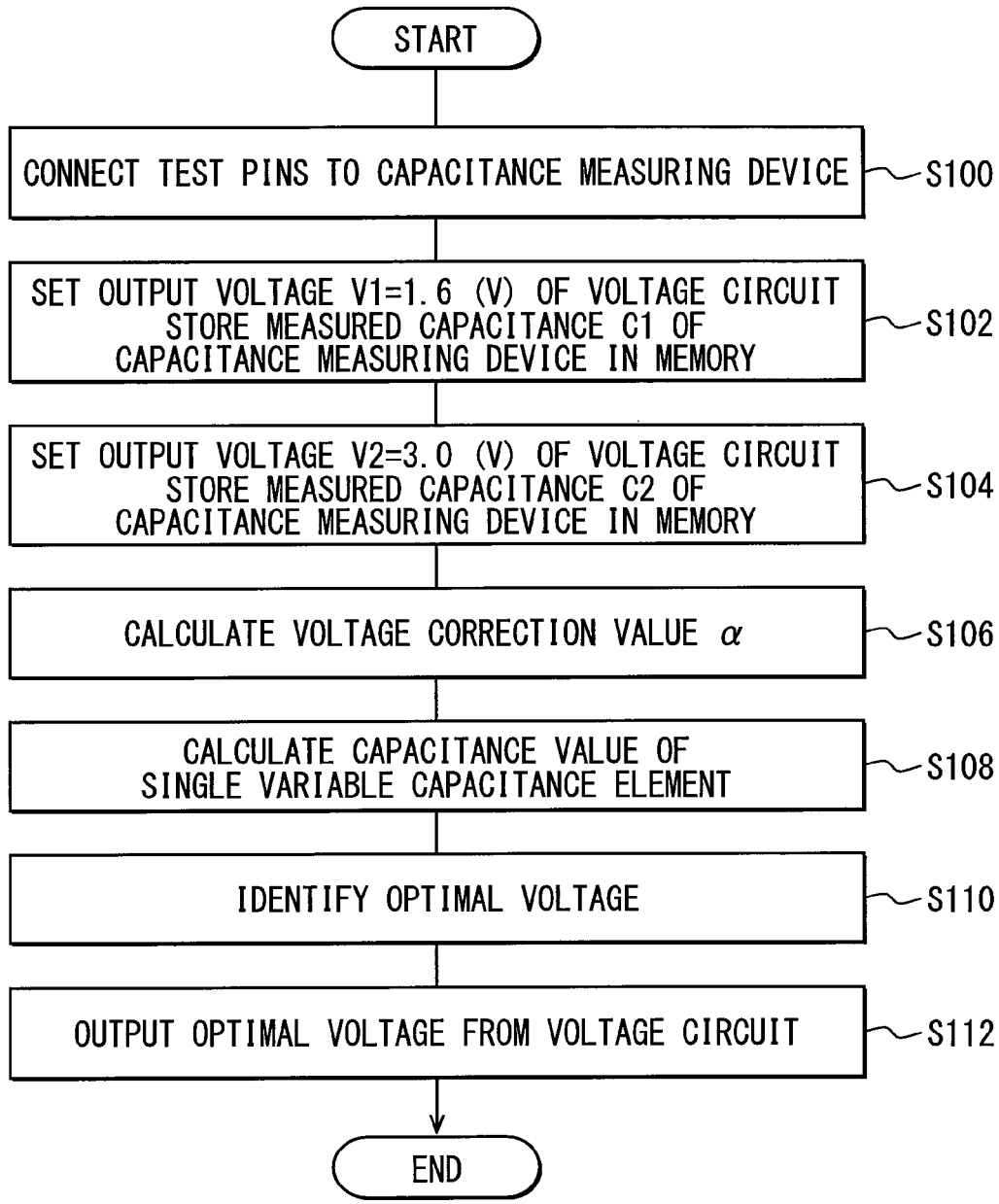
FIG. 4 is a diagram illustrating a procedure of a method of adjusting an impedance of the communication device.

Subsequently, a description will be given of a method of adjusting the impedance of the communication circuit 1 with reference to FIG. 4. It is assumed that the capacitance measuring device 2 and the control board 3 have already been connected to each other through a communication line, and the control board 3 and the control unit 40 have already been connected to each other through the communication line.

First, an operator connects the test pins P1, P2, and the respective measurement terminals of the capacitance measuring device 2 (S100).

Then, the output voltage of the voltage circuit 50 is set to the first voltage V1=1.6 (V), and the measured capacitance C1 measured by the capacitance measuring device 2 is stored in the memory 40a (S102). In the present embodiment, when the power supply switch disposed on the control board 3 operates by the aid of the operator, the power delivery from the DC stabilized power supply (not shown) to the communication device 1 starts. Further, when the adjustment start switch operates, the applied voltage (first voltage) V1=1.6 (V) corresponding to the digital signals output in parallel by the control unit 40 is output from the voltage circuit 50. Then, the first voltage V1 is applied to the variable capacitance diode 21 of the matching circuit 20. Also, the voltage circuit 50 instructs the capacitance measuring device 2 to measure the capacitance of the variable capacitance diode 21, and in response to the present instruction, the measured capacitance C1 measured by the capacitance measuring device 2 is input to the control unit 40 through the control board 3. The control unit 40 stores the measured capacitance C1 in the memory 40a.

Then, the output voltage of the voltage circuit 50 is set to the second voltage V2=3.0 (V), and the measured capacitance C2 measured by the capacitance measuring device 2 is stored in the memory 40a (S104). In the present embodiment, the applied voltage (second voltage) V2=3.0 (V) corresponding to the digital signals output in parallel by the control unit 40 is output from the voltage circuit 50. Then, the second voltage V2 is applied to the variable capacitance diode 21 of the matching circuit 20. Also, the voltage circuit 50 instructs the capacitance measuring device 2 to measure the capacitance of the variable capacitance diode 21, and in response to the present instruction, the measured capacitance C2 measured by the capacitance measuring device 2 is input to the control unit 40 through the control board 3. The control unit 40 stores the measured capacitance C2 in the memory 40a.

Then, the voltage correction value α is calculated (S106). Specifically, the voltage correction value α is calculated by the control unit 40 using Numerical Expressions 2 to 6.

Subsequently, the capacitance value of the single variable capacitance diode 21 is calculated (S108). Specifically, the capacitance value of the single variable capacitance diode 21 is calculated by the control unit 40 using Numerical Expression 7.

Then, the optimal voltage (correction voltage) is identified (S110). Specifically, the optimal voltage (correction voltage) such that the capacitance value of the variable capacitance diode 21 becomes a desired capacitance value is calculated by the control unit 40 using Numerical Expression 7.

Then, the optimal voltage is output from the voltage circuit 50 (S112). Specifically, the digital signals output from the control unit 40 to the voltage circuit 50 are identified to output the optimal voltage (correction voltage) from the voltage circuit 50, and the digital signals are output to the voltage circuit 50, and also stored in the memory 40a, to thereby terminate the adjustment of the applied voltage.

When the adjustment of the applied voltage is terminated as described above, the control unit 40 reads the digital signals stored in the memory 40a at the time of starting the operation, and outputs the digital signals to the voltage circuit 50 to output the optimal voltage (correction voltage) from the voltage circuit 50.

According to the above configuration, the control unit 40 changes the applied voltage output from the voltage circuit 50, allows the capacitance measuring device 2 connected to the variable capacitance diode 21 to measure the respective capacitance values C1 and C2 of the variable capacitance diode 21 before and after the change in the applied voltage, calculates the voltage correction value α for correcting the initial variation of the capacitance value of the variable capacitance diode 21 using the respective capacitance values C1 and C2 of the variable capacitance diode 21 before and after the change in the applied voltage, and the respective applied voltage values V1 and V2 before and after the change, calculates the correction voltage of the variable capacitance diode 21 so as to cancel the initial variation in the capacitance value of the variable capacitance diode 21 using the voltage correction value α, and adjusts the applied voltage output from the voltage circuit 50 so as to output the correction voltage from the voltage circuit 50. As a result, for example, the matching circuit 20 can be adjusted without inputting the local oscillator signal to the matching circuit 20 having the variable capacitance element, and the applied voltage of the variable capacitance element can be so adjusted as to suppress an influence of the initial variation in the capacitance value of the variable capacitance element with the simple configuration and with the simple operation.

The control unit 40 can substitute the respective capacitance values C1 and C2 of the variable capacitance diode 21 before and after the change in the applied voltage, and the respective applied voltage values V1 and V2 before and after the change into an approximate expression representing a standard C–V characteristic of the variable capacitance diode 21 to calculate the voltage correction value α.

Also, the memory 40a is provided which stores data for outputting the correction voltage from the voltage circuit 50, and the applied voltage output from the voltage circuit 50 is adjusted based on the data stored in the memory 40a. As a result, after the data for outputting the correction voltage from the voltage circuit 50 is stored in the memory 40a, the correction voltage can be stably output from the voltage circuit 50.

Also, the test pins P1 and P2 for measuring the capacitance value of the variable capacitance diode 21 are connected to the voltage application terminal of the variable capacitance diode 21. As a result, the measurement terminals of the capacitance measuring device 2 can be easily connected thereto using those test pins P1 and P2.

The present disclosure is not limited to the above embodiment, but can be implemented in various configurations based on the spirit of the present disclosure.

For example, in the above embodiment, the configuration illustrated in FIG. 1 is applied as the matching circuit 20. However, the present disclosure is not limited to the configuration illustrated in FIG. 1.

Also, in the above embodiment, the control unit 40 changes the applied voltage output from the voltage circuit 50, allows the capacitance measuring device 2 connected to the variable capacitance diode 21 to measure the respective capacitance values C1 and C2 of the variable capacitance diode 21 before and after the change in the applied voltage, calculates the voltage correction value α for correcting the initial variation of the capacitance value of the variable capacitance diode 21 using the respective capacitance values C1 and C2 of the variable capacitance diode 21 before and after the change in the applied voltage, and the respective applied voltage values V1 and V2 before and after the change, calculates the correction voltage of the variable capacitance diode 21 so as to cancel the initial variation in the capacitance value of the variable capacitance diode 21 using the voltage correction value α, and adjusts the applied voltage output from the voltage circuit 50 so as to output the correction voltage from the voltage circuit 50. However, the present disclosure is not limited to the above method. For example, a work for measuring the respective capacitance values C1 and C2 of the variable capacitance diode 21 before and after the change in the applied voltage is conducted by an operator for the capacitance measuring device 2 connected to the variable capacitance diode 21. Thus, a part or all of the work may be conducted by the operator. In the present case, for example, the control unit 40 is connected with a personal computer, and the voltage correction value α and the correction voltage may be calculated, and an instruction on the correction voltage to the control unit 40 may be conducted, using the personal computer. In this way, the present disclosure can be captured by not only the communication device, but also the method of adjusting an applied voltage for the matching circuit.

Also, in the above embodiment, V1=1.6 (V) as the first voltage, and the V2=3.0 (V) as the second voltage are applied to the variable capacitance diode 21 to measure the respective capacitance values (C1, C2) of the variable capacitance diode 21. However, the present disclosure is not limited to the above voltage values.

Also, in the above embodiment, the variable capacitance diode 21 is used as the variable capacitance element. However, the variable capacitance element is not limited to the variable capacitance diode.

In the above embodiments, the control unit 40 may include the capacitance value measurement unit, the voltage correction value calculation unit, the correction voltage calculation unit, and the voltage circuit control unit. In the present case, the capacitance value measurement unit conducts the processing of S102 and S104, the voltage correction value calculation unit conducts the processing of S106, the correction voltage calculation unit conducts the processing of S110, and the voltage circuit control unit conducts the processing of S112. Also, the memory 40a exemplifies the storage unit.

What is claimed is:

1. A communication device comprising: a matching circuit that includes a variable capacitance element having a capacitance value varied according to an applied voltage output from a voltage circuit; and a control unit that controls the applied voltage output from the voltage circuit,
   wherein the control unit includes:
   a capacitance value measurement unit that changes the applied voltage output from the voltage circuit, and allows a capacitance measuring device connected to the variable capacitance element to measure respective capacitance values of the variable capacitance element before and after a change in the applied voltage;
   a voltage correction value calculation unit that calculates a voltage correction value for correcting an initial variation of the capacitance value of the variable capacitance element using the respective capacitance values of the variable capacitance element before and after the change in the applied voltage, and respective applied voltage values before and after the change;
   a correction voltage calculation unit that calculates a correction voltage of the variable capacitance element for canceling the initial variation in the capacitance value of the variable capacitance element using the voltage correction value; and
   a voltage circuit control unit that adjusts the applied voltage output from the voltage circuit so as to output the correction voltage from the voltage circuit,
   wherein the control unit adjusts the matching circuit without inputting an oscillation signal into the matching circuit.

2. The communication device according to claim 1, wherein the control unit substitutes the respective capacitance values of the variable capacitance element before and after the change in the applied voltage, and the respective applied voltage values before and after the change into an approximate expression representing a standard C–V characteristic of the variable capacitance element to calculate the voltage correction value.

3. The communication device according to claim 1, further comprising:
   a storage unit that stores data for outputting the correction voltage from the voltage circuit,
   wherein the voltage circuit control unit adjusts the applied voltage output from the voltage circuit based on the data stored in the storage unit.

4. The communication device according to claim 1, wherein test pins for measuring a capacitance value of the variable capacitance element are connected to voltage application terminals of the variable capacitance element.

5. A method of adjusting an applied voltage for a matching circuit that includes a variable capacitance element having a capacitance value varied according to an applied voltage output from a voltage circuit, the method comprising:
- changing the applied voltage output from the voltage circuit, and allowing a capacitance measuring device connected to the variable capacitance element to measure respective capacitance values of the variable capacitance element before and after a change in the applied voltage;
- calculating a voltage correction value for correcting an initial variation of the capacitance value of the variable capacitance element using the respective capacitance values of the variable capacitance element before and after the change in the applied voltage, and respective applied voltage values before and after the change;
- calculating a correction voltage of the variable capacitance element for canceling the initial variation in the capacitance value of the variable capacitance element using the voltage correction value;
- adjusting the applied voltage output from the voltage circuit so as to output the correction voltage from the voltage circuit; and
- adjusting the matching circuit without inputting an oscillation signal into the matching circuit.

* * * * *

UNITED STATES PATENT AND TRADEMARK OFFICE
CERTIFICATE OF CORRECTION

PATENT NO. : 9,531,340 B2
APPLICATION NO. : 14/406695
DATED : December 27, 2016
INVENTOR(S) : Takashi Saitou et al.

It is certified that error appears in the above-identified patent and that said Letters Patent is hereby corrected as shown below:

On the Title Page

At (87), "PCT Pub. Date: Dec. 9, 2013" should be --PCT Pub. Date: Dec. 19, 2013--.

Signed and Sealed this
Fourth Day of April, 2017

Michelle K. Lee
*Director of the United States Patent and Trademark Office*